(12) United States Patent
Kim et al.

(10) Patent No.: US 10,998,906 B1
(45) Date of Patent: May 4, 2021

(54) LOGIC DEVICE USING SPIN TORQUE

(71) Applicant: KOREA INSTITUTE OF SCIENCE AND TECHNOLOGY, Seoul (KR)

(72) Inventors: Kyoung Whan Kim, Seoul (KR); Dong Soo Han, Seoul (KR); Byoung Chul Min, Seoul (KR); Seok Min Hong, Seoul (KR); Hyun Cheol Koo, Seoul (KR); Hyung Jun Kim, Seoul (KR); Tae Eon Park, Seoul (KR); Ouk Jae Lee, Seoul (KR)

(73) Assignee: KOREA INSTITUTE OF SCIENCE AND TECHNOLOGY

( * ) Notice: Subject to any disclaimer, the term of this patent is extended or adjusted under 35 U.S.C. 154(b) by 0 days.

(21) Appl. No.: 16/774,322

(22) Filed: Jan. 28, 2020

(30) Foreign Application Priority Data

Oct. 23, 2019 (KR) .......... 10-2019-0132010

(51) Int. Cl.
*G11C 11/16* (2006.01)
*H03K 19/16* (2006.01)
*H03K 19/20* (2006.01)

(52) U.S. Cl.
CPC .......... *H03K 19/16* (2013.01); *G11C 11/161* (2013.01); *G11C 11/1675* (2013.01); *H03K 19/20* (2013.01)

(58) Field of Classification Search
CPC . G11C 11/161; G11C 11/1675; H01L 27/222; H01L 43/02; H01L 43/08; H03K 19/16; H03K 19/20

USPC .......................................................... 365/158
See application file for complete search history.

(56) References Cited

U.S. PATENT DOCUMENTS

| | | | | |
|---|---|---|---|---|
| 8,018,011 | B2* | 9/2011 | Ranjan | G11C 11/1673 257/421 |
| 9,105,830 | B2* | 8/2015 | Khvalkovskiy | G11C 11/16 |
| 10,360,963 | B2* | 7/2019 | Park | G11C 11/18 |
| 10,490,735 | B2* | 11/2019 | Sasaki | H01L 43/06 |
| 10,600,465 | B1* | 3/2020 | Araki | G11C 11/1655 |
| 10,693,058 | B2* | 6/2020 | Lee | H01L 43/10 |
| 10,734,054 | B2* | 8/2020 | Min | G11C 11/18 |
| 2019/0334080 | A1* | 10/2019 | Ahmed | G11C 11/1653 |

* cited by examiner

*Primary Examiner* — Son L Mai
(74) *Attorney, Agent, or Firm* — Mendelsohn Dunleavy, P.C.

(57) ABSTRACT

A logic function device according to an embodiment of the present invention includes one or more function reconfiguring units having magnetization in one direction set by spin torque caused due to an function reconfiguring current, and an output terminal formed at an end thereof; and one or more input units formed on the function reconfiguring unit and having magnetization in the one direction set by spin torque caused due to an input current, wherein an output voltage of the output terminal is determined on the basis of whether a magnetization direction of the function reconfiguring unit and a magnetization direction of the input unit are parallel or anti-parallel.

14 Claims, 11 Drawing Sheets

SPIN-POLARIZED CURRENT

LOGIC DEVICE USING SPIN TORQUE

CROSS REFERENCE TO RELATED APPLICATION

The present application claims priority to Korean Patent Application No. 10-2019-0132010, filed Oct. 23, 2019, the entire contents of which is incorporated herein for all purposes by this reference.

BACKGROUND OF THE INVENTION

Field of the Invention

The present invention relates to a logic function device using spin torque and, more particularly, to a logic device that is capable of reconfiguring the logic function through electrical signals in the same structure.

Description of the Related Art

A logic device, which performs logic operations in integrated circuits, is one of high added value products along with a memory device. However, recently, as silicon-based electronic device technology (complementary metal-oxide semiconductor, CMOS) is approaching physical limitations, it is difficult to expect further density improvement, and problems such as high power consumption and heat generation are also caused. Accordingly, it is required to develop next-generation logic devices with new mechanisms, escaping from CMOS-based technologies in the related art.

Since a nano-spin device using a magnetic material is characterized by having non-volatility and is capable of low-power and ultra-fast information control, the nano-spin device is one of the promising candidate technologies as the next generation information processing device. In particular, the non-volatility of the spin element cuts off the unnecessary power supply of the circuit every logic operation, whereby there are advantages that standby power is lowered and high-efficiency logic operations capable of being operated at low power consumption are possible. Furthermore, a reset function and high speed operation are improved.

The basic driving principle of the spin device is to control the spin that is an intrinsic physical quantity of electrons, by an electrical signal. The spin device is required to control the magnetization direction in the magnetic layer through the electrical signal to write the information efficiently and quickly, and accurately read the magnetic information. To this end, as representative technologies, the spin device typically uses a spin-torque technology including spin-transfer torque (STT) and spin-orbit torque (SOT) for magnetization switching, and the magnetoresistance effect, such as giant magnetoresistance (GMR), tunneling magnetoresistance (TMR), and the like for reading magnetization information in a magnetic layer.

SUMMARY OF THE INVENTION

Accordingly, the present invention has been made keeping in mind the above problems occurring in the related art, and an objective of the present invention is to provide an reconfigurable logic device that is capable of electrically resetting a logic function in the same device, in order to fundamentally overcome physical limitations of existing silicon devices by using spin torque technology.

However, the object is exemplary, and the scope of the present invention is not limited thereto, and embodiments according to the present invention may be used to achieve other objects not specifically mentioned in addition to the above objects.

A logic function device according to an embodiment of the present invention includes: one or more function reconfiguring units having magnetization in one direction set by spin torque caused due to a function reconfiguring current, and an output terminal formed at an end thereof; and one or more input units formed on the function reconfiguring unit and having magnetization in the one direction set by spin torque caused due to an input current, wherein an output voltage of the output terminal is determined on the basis of whether a magnetization direction of the function reconfiguring unit and a magnetization direction of the input unit are parallel or anti-parallel.

The magnetization directions of the function reconfiguring unit and the input unit may be any one of a vertical direction and a horizontal direction.

The function reconfiguring unit may include: a function reconfiguring electrode layer through which the function reconfiguring current flows; and a function reconfiguring magnetic layer formed on the function reconfiguring electrode layer and having magnetization in one direction set by the function reconfiguring current, wherein the output terminal is formed in the function reconfiguring electrode layer.

The input unit may include: an input magnetic layer formed on the function reconfiguring unit and having magnetization in the one direction; and an input electrode layer formed on the input magnetic layer and through which the input current flows to manipulate the magnetization of the input magnetic layer;

The number of the function reconfiguring units may be one; the number of the input units may be one; a value ($V_P$) of the output voltage when the magnetization direction of the function reconfiguring unit and the magnetization direction of the input unit are parallel, is greater than a value (Vap) of the output voltage when the magnetization direction of the function reconfiguring unit and the magnetization direction of the input unit are anti-parallel; and the output value is set to "1" when the value of the output voltage is $V_P$, and the output value is set to "0" when the value of the output voltage is Vap, to perform a NOT logic operation.

The number of function reconfiguring units may be one; the number of input units may be multiple and horizontally arranged on the function reconfiguring unit; and the magnetization direction of the function reconfiguring unit may be set to be the same for the multiple input units.

The input unit may include a first input unit and a second input unit; one terminal of the function reconfiguring unit located on the first input unit may be connected to a ground voltage, and the output terminal may be horizontally opposite to the one terminal of the function reconfiguring unit and located on the second input unit; a maximum value ($V_{max}$) of the output voltage when the magnetization direction of the first input unit and the magnetization direction of the function reconfiguring unit are parallel, and the magnetization direction of the second input unit the magnetization direction of the function reconfiguring unit are parallel, a first value ($V_1$) of the output voltage when the magnetization direction of the first input unit and the magnetization direction of the function reconfiguring unit are anti-parallel, and the magnetization direction of the second input unit and the magnetization direction of the function reconfiguring unit are parallel, a second value ($V_2$) of the output voltage when the magnetization direction of the first input unit and the magnetization direction of the function reconfiguring unit are parallel, and the magnetization direction of the second input unit and the magnetization direction of the function reconfiguring unit are anti-parallel, and a minimum value ($V_{min}$) of the output voltage when the magnetization direction of the first input unit and the magnetization direction of the function reconfiguring unit are anti-parallel, and the magnetization direction of the second input unit and the magnetization direction of the function reconfiguring unit are anti-parallel may satisfy the following relationship:

$$V_{max} > V_1 > V_2 > V_{min}.$$

The magnetization direction of the function reconfiguring unit may be an up direction; a reference voltage (Vref) may be set between the maximum value ($V_{max}$) of the output voltage and the first value ($V_1$) of the output voltage; and the output value may be set to "1" when the output voltage is greater than the reference voltage, and the output value is set to "0" when the output voltage is less than the reference voltage, thereby performing an AND logic operation.

The magnetization direction of the function reconfiguring unit may be an up direction; a reference voltage (Vref) may be set between the second value ($V_2$) of the output voltage and the minimum value ($V_{min}$) of the output voltage; and the output value may be set to "1" when the output voltage is greater than the reference voltage, and the output value may be set to "0" when the output voltage is less than the reference voltage, thereby performing an OR logic operation.

The magnetization direction of the function reconfiguring unit may be a down direction; a reference voltage (Vref) may be set between the maximum value ($V_{max}$) of the output voltage and the first value ($V_1$) of the output voltage; and the output value may be set to "1" when the output voltage is greater than the reference voltage, and the output value is set to "0" when the output voltage is less than the reference voltage, thereby performing a NOR logic operation.

The magnetization direction of the function reconfiguring unit may be a down direction; a reference voltage (Vref) may be set between the second value ($V_2$) of the output voltage and the minimum value ($V_{min}$) of the output voltage; and the output value may be set to "1" when the output voltage is greater than the reference voltage, and the output value is set to "0" when the output voltage is less than the reference voltage, thereby performing a NAND logic operation.

The input unit may include a third input unit, a fourth input unit, and a fifth input unit; and one terminal of the function reconfiguring unit located on the third input unit may be connected to a ground voltage, and the output terminal may be horizontally opposite to the one terminal of the function reconfiguring unit and located on the fifth input unit side, thereby performing a ternary logic operation.

The magnetization direction of the function reconfiguring unit may be an up direction; the reference voltage is set between a value of the output voltage when the magnetization direction of the third input unit and the magnetization direction of the function reconfiguring unit are parallel, the magnetization direction of the fourth input unit and the magnetization direction of the function reconfiguring unit are parallel, and the magnetization direction of the fifth input unit and the magnetization direction of the function reconfiguring unit are parallel, and a value of the output voltage when the magnetization direction of the third input unit and the magnetization direction of the function reconfiguring unit are anti-parallel, the magnetization direction of the fourth input unit and the magnetization direction of the function reconfiguring unit are parallel, and the magnetization direction of the fifth input unit and the magnetization direction of the function reconfiguring unit are parallel; and the output value may be set to "1" when the output voltage is greater than the reference voltage, and the output value may be set to "0" when the output voltage is less than the reference voltage, thereby performing a ternary AND logic operation.

The one or more function reconfiguring units and the one or more input units may be each horizontally arranged, and the function reconfiguring unit and the input unit may be formed to vertically correspond to each other; and the magnetization directions of the one or more function reconfiguring units may be set independently of each other.

The one or more function reconfiguring units may include: a function reconfiguring electrode layer through which the function reconfiguring current flows; and multiple function reconfiguring magnetic layers horizontally formed on the function reconfiguring electrode layer at a predetermined interval and having magnetization in the one direction set by the function reconfiguring current, wherein a part of the multiple function reconfiguring magnetic layers to which a voltage may be applied in the one direction and a remainder of the function reconfiguring magnetic layers to which the voltage is not applied have magnetic anisotropy different from each other, and the magnetization directions of the part of the multiple reset magnetic layers and the remainder of the function reconfiguring magnetic layers may be set opposite to each other by the function reconfiguring current.

According to the embodiment of the present invention, it is possible to fundamentally overcome the physical limitations of the silicon device in the related art.

Further, according to the embodiment of the present invention, in addition to the input magnetic layer that receives the input signal, a function reconfiguring magnetic layer determining properties of logic operation is introduced and is controlled in a nonvolatile manner, thereby resetting the logic function in the same structure.

BRIEF DESCRIPTION OF THE DRAWINGS

The above and other objects, features, and other advantages of the present invention will be more clearly understood from the following.

DETAILED DESCRIPTION OF THE INVENTION

Hereinafter, embodiments of the present invention will be described in detail with reference to the drawings.

Figure 1:
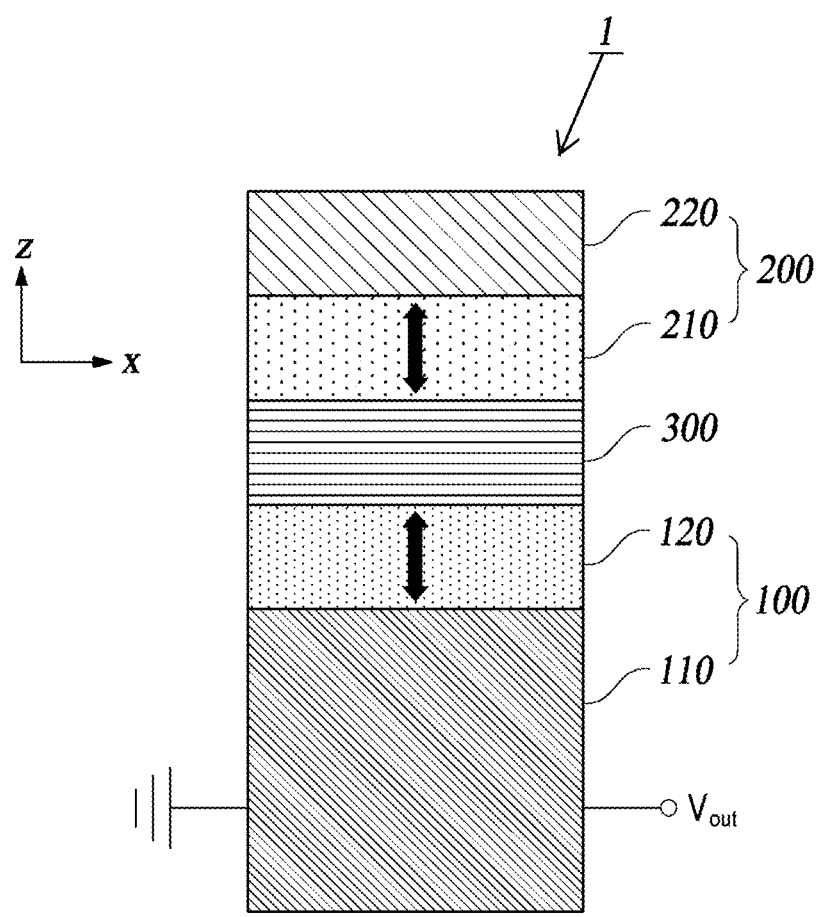
FIG. 1 is a cross-sectional view illustrating a logic function device according to an embodiment of the invention.

FIG. 1 is a cross-sectional view illustrating a logic function device according to an embodiment of the invention.

Referring to FIG. 1, the logic function device 1 includes one or more function reconfiguring units 100 having magnetization in one direction set by spin torque caused due to function reconfiguring current, and an output terminal formed at an end thereof; and at least one input unit 200 formed on the function reconfiguring unit and having magnetization in the one direction set by spin torque caused due to an input current, in which an output voltage $V_{out}$ of the output terminal is determined on the basis of whether the magnetization direction of the function reconfiguring unit and the magnetization direction of the input unit are parallel or anti-parallel. An insulating tunnel junction 300 may be formed between the function reconfiguring unit 100 and the input unit 200.

In the present specification, the vertical direction refers to the z direction in the drawings. In addition, the horizontal direction means the x direction in the drawing. Spin torque means including spin-transfer torque and spin-orbit torque. The up direction and down direction with respect to the magnetization direction indicate two magnetic states in the magnetic layer and may vary according to the magnetization direction in which the magnetic layer prefers.

For example, when the vertical magnetization is preferred, the up and down directions mean upward and downward, respectively, and when the horizontal magnetization is preferred, the up and down directions mean leftward and rightward, respectively.

The magnetization directions of the function reconfiguring unit 100 and the input unit 200 may be any one of a vertical direction and a horizontal direction. That is, the magnetization directions of the function reconfiguring unit 100 and the input unit 200 may both be in the vertical direction, or the magnetization directions of the function reconfiguring unit 100 and the input unit 200 may both be in the horizontal direction.

Hereinafter, the case in which the magnetization directions of the function reconfiguring unit 100 and the input unit 200 are both in the vertical direction will be described. However, the scope of the present invention is not limited thereto, and the function reconfiguring unit 100 and the input unit 200 may be in the same direction (including the opposite direction).

The function reconfiguring unit 100 has magnetization in the vertical direction set by spin torque caused due to a function reconfiguring current, and an output terminal formed at an end thereof.

The function reconfiguring unit 100 includes an function reconfiguring electrode layer 110 through which function reconfiguring current flows; and an function reconfiguring magnetic layer 120 formed on the function reconfiguring electrode layer 110 and having magnetization in one direction, for example, a vertical direction, set by the function reconfiguring current, in which the output terminal may be formed in the function reconfiguring electrode layer 110.

The function reconfiguring current flows in the function reconfiguring electrode layer 110, and the magnetization is vertically in the function reconfiguring magnetic layer 120 set by spin torque caused due to the function reconfiguring current. The magnetization direction in the function reconfiguring magnetic layer 120 may be in the up direction or the down direction. In FIG. 1, a vertical bi-directional arrow in the function reconfiguring magnetic layer 120 indicates the magnetization in the up direction and the magnetization in the down direction at the same time.

The input unit 200 is formed on the function reconfiguring unit 100, and has magnetization in the same direction as the function reconfiguring unit 100, for example, a vertical direction, set by spin torque caused due to the input current.

The input unit 200 includes an input magnetic layer 210 formed on the function reconfiguring unit 100 and having magnetization in one direction, for example, a vertical direction; and an input electrode layer 220 formed on the input magnetic layer 210 and through which a current flows to manipulate the magnetization in the input magnetic layer 210.

The input current flows in the input electrode layer 220, and the magnetization is vertically in the input magnetic layer 210 set by spin torque caused due to the input current. The magnetization direction in the input magnetic layer 210 may be in the up direction or in the down direction. In FIG. 1, a vertical bi-directional arrow in the input magnetic layer 210 indicates magnetization in the up direction and magnetization in the down direction at the same time.

An output voltage $V_{out}$ of the output terminal is determined on the basis of whether the magnetization direction of the function reconfiguring unit 100 and the magnetization direction of the input unit 200 are parallel or anti-parallel.

In this specification, what the magnetization directions are parallel means that both magnetization directions are the same, i.e., both are up directions or both are down directions. What magnetization directions are anti-parallel means that both magnetization directions are opposite to each other, i.e., one direction is up direction and the other direction is down direction.

A method of determining the output voltage $V_{out}$ of the output terminal according to the magnetization direction of the function reconfiguring unit 100 and the magnetization direction of the input unit 200 will be described later.

Figure 2A:
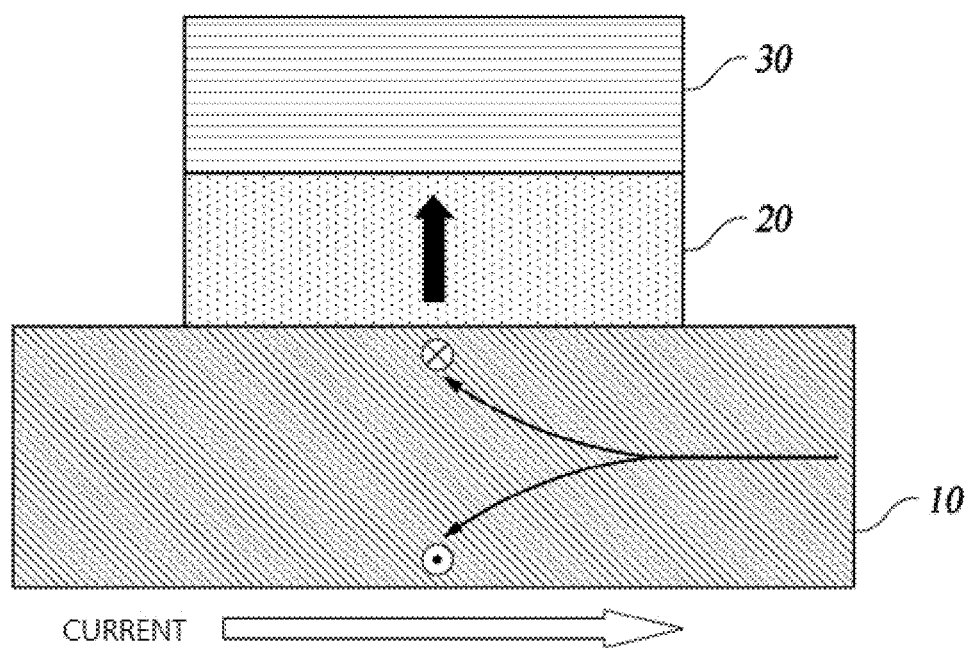
FIGS. 2A and 2B are diagrams illustrating a spin-orbit torque and a spin-transfer torque generated by the function reconfiguring unit and the input unit of FIG. 1, respectively.
Figure 2B:
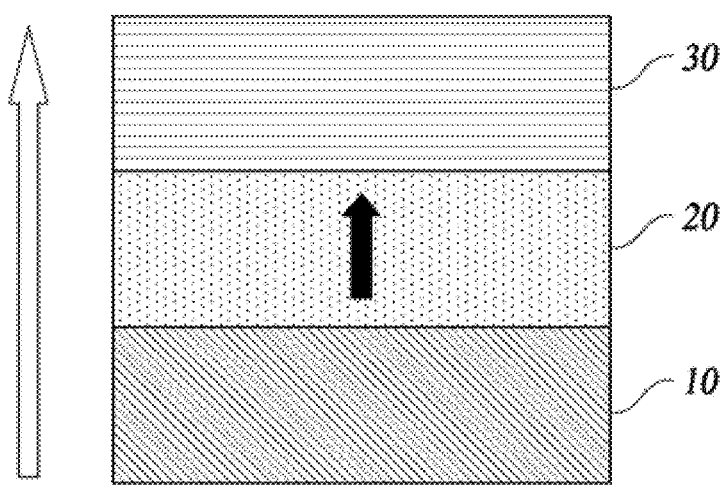

FIG. 2A is a diagram illustrating a spin-orbit torque generated by the function reconfiguring unit 100 and the input unit 200 of FIG. 1, and FIG. 2B is a diagram illustrating a spin-transfer torque generated at the function reconfiguring unit 100 and the input unit 200 of FIG. 1.

In FIGS. 2A and 2B, an electrode layer 10 corresponds to the function reconfiguring electrode layer 110 of the function reconfiguring unit 100 or the input electrode layer 220 of the input unit 200; a magnetic layer 20 corresponds to the function reconfiguring magnetic layer 120 of the function reconfiguring unit 100 or the input magnetic layer 210 of the input unit 200; and the tunnel junction layer 30 corresponds to the tunnel junction 300.

Referring to FIGS. 2A and 2B, when a current flows in the electrode layer 10, the magnetization direction of the magnetic layers 20 adjacent to the electrode layer 10 may be controlled through the spin-orbit torque or the spin-transfer torque. The magnetization direction is determined according to the direction of the current flowing in the electrode layer 10. FIG. 2A shows that a current flows perpendicularly to the vertical direction in the case of spin-orbit torque, and FIG. 2B shows that a spin-polarized current flows vertically in the case of spin-transfer torque, but the magnetization direction may vary according to the current or the spin polarization current, depending on the interface between material forming the electrode layer 10 and the magnetic layer 20. Accordingly, when a current is applied to the function reconfiguring electrode layer 110 of FIG. 1, the magnetization direction of the function reconfiguring magnetic layer 120 adjacent to the function reconfiguring electrode layer 110 may be controlled. The magnetization direction of the function reconfiguring magnetic layer 120 is determined according to the direction of the current applied to the function reconfiguring electrode layer, and the direction of the current is determined according to the logic operation to be performed by the logic device.

In addition, when a current is applied to the input electrode layer 220, the magnetization direction of the input magnetic layer 210 adjacent to the input electrode layer 220 may be controlled. The magnetization direction of the input magnetic layer 210 is determined according to the direction of the current applied to the input electrode layer 220, and the direction of the current may be determined according to the input value of the logic device.

The above-described spin torque may be used to independently control the magnetization directions of the function reconfiguring magnetic layer 120 and the input magnetic layer 210 according to the present embodiment, which may be parallel or anti-parallel to each other.

Figure 3A:
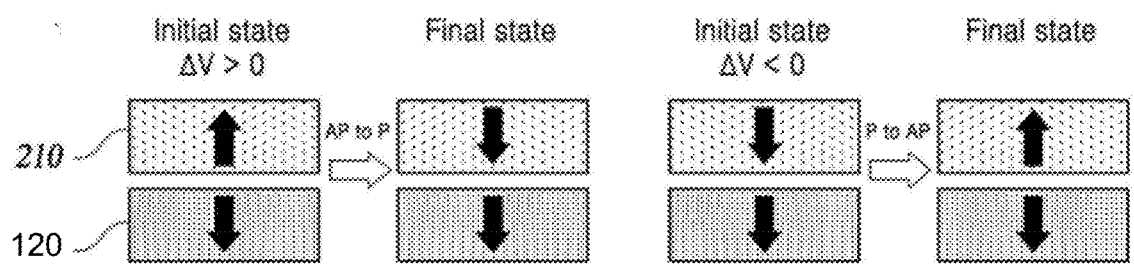
FIGS. 3A and 3B are diagrams illustrating resistance according to magnetization directions of the function reconfiguring magnetic layer 120 and the input magnetic layer 210 of FIG. 1.
Figure 3B:
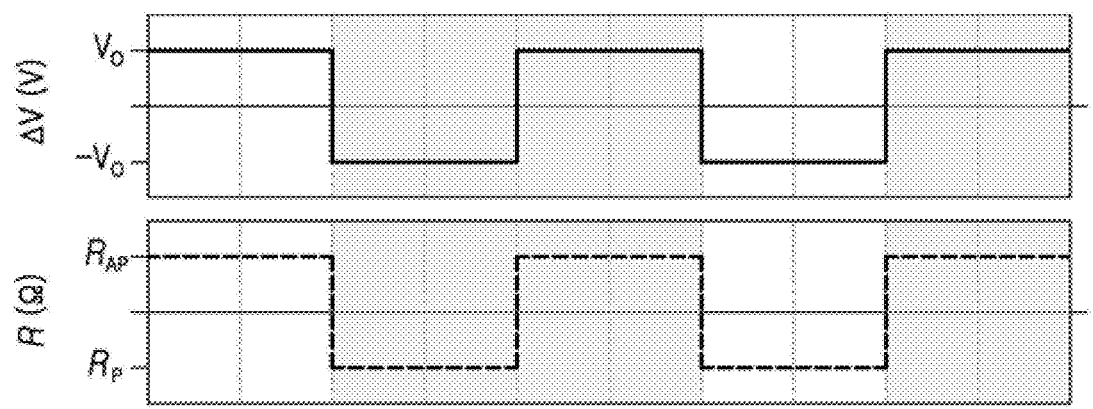

FIGS. 3A and 3B are diagrams illustrating resistance according to magnetization directions of the function reconfiguring magnetic layer 120 and the input magnetic layer 210 of FIG. 1.

Referring to FIGS. 3A and 3B, the vertical resistance of the logic function device 1 of FIG. 1 is determined according to a relative direction of the magnetization direction of the function reconfiguring unit 100 to the magnetization direction of the input unit 200. For example, while the magnetization direction of the function reconfiguring magnetic layer 110 is fixed vertically downward, the magnetization direction of the input magnetic layer 210 may be changed by applying a potential difference ΔV in the y direction to the input current layer 220. As shown in FIGS. 3A and 3B, when ΔV is Vo (where Vo>0), the magnetization direction of the input magnetic layer 210 is vertically upward, so that the magnetization directions of the function reconfiguring magnetic layer 110 and the input magnetic layer 210 are anti-parallel, and when ΔV is −Vo, the magnetization direction of the input magnetic layer 210 is vertically downward, so that the magnetization directions of the function reconfiguring magnetic layer 110 and the input magnetic layer 210 are parallel. Herein, Vo is equal to or greater than a threshold voltage value for generating magnetization in the input magnetic layer 210.

As shown in FIG. 3B, when the magnetization direction of the function reconfiguring unit 100 and the magnetization direction of the input unit 200 are parallel to each other, the resistance value of the logic function device 1 is "$R_P$", and when they are anti-parallel, the resistance value is "$R_{AP}$". Herein, it is general that $R_{AP}>R_P$ is satisfied.

Figure 4:
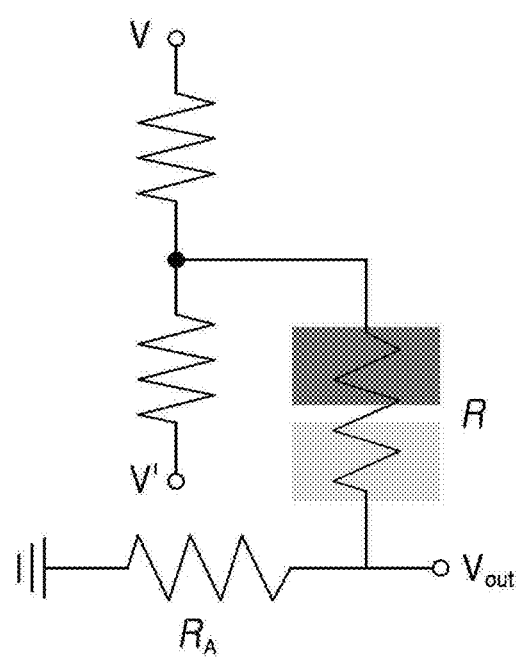
FIG. 4 is a circuit diagram modeling the logic function device 1 of FIG. 1.

FIG. 4 is a circuit diagram modeling the logic function device 1 of FIG. 1.

Referring to FIG. 4, when a voltage difference is applied across both ends V and V' of the y direction of the input electrode layer 220 to apply a current to the input electrode layer 220, the voltage of an upper end portion of the logic function device 1 becomes an intermediate value of the voltage applied across both ends V and V' of the input electrode layer 220. The resistance R is a vertical resistance value according to the magnetization direction of the function reconfiguring unit 100 and the magnetization direction of the input unit 200. The resistance $R_A$ is a horizontal resistance value between the ground voltage and the output voltage of the function reconfiguring unit 100.

In the logic function device 1 of FIG. 1, the value $V_P$ of the output voltage $V_{out}$ when the magnetization direction of the function reconfiguring unit 100 and the magnetization direction of the input unit 200 are parallel is larger than the value Vap of the output voltage $V_{out}$ when the magnetization direction of the function reconfiguring unit 100 and the magnetization of the input unit 200 are anti-parallel; the output value is set to '1' when the value of the output voltage $V_{out}$ is $V_P$; and the output value is set to '0' when the value of the output voltage $V_{out}$ is Vap, thereby performing a NOT logic operation.

For example, a current is applied to the function reconfiguring electrode layer 110, so that the magnetization direction of the function reconfiguring magnetic layer 120 is set to the down direction. When the input is "1", the current flows in the +y direction in the input current layer 220 such that the magnetization direction of the input magnetic layer 210 is in the up direction. Accordingly, the magnetization direction (down) of the function reconfiguring magnetic layer 120 and the magnetization direction (up) of the input magnetic layer 210 are anti-parallel, in which the resistance R is referred to as $R_{AP}$ and the output voltage $V_{out}$ is referred to as $V_{AP}$. Meanwhile, when the input is "0", the current flows in the −y direction in the input current layer 220 so that the magnetization direction of the input magnetic layer 210 is in the down direction. Accordingly, the magnetization direction (down) of the function reconfiguring magnetic layer 120 and the magnetization direction (down) of the input magnetic layer 210 are anti-parallel, in which the resistance R is referred to as $R_P$, and the output voltage $V_{out}$ is referred to as $V_P$. The higher the resistance value of the resistor R, the higher the voltage drop, and thus the lower the output voltage $V_{out}$, thereby satisfying $V_P>V_{AP}$. When the reference voltage value Vref is set to satisfy $V_P>V_{ref}>V_{AP}$; the output value is set to "1" when the output voltage is higher than the reference voltage value; and the output value is set to "0" when the output voltage is lower than the reference voltage value, a NOT logic may be constructed as in Table 1 below.

TABLE 1

| Input value | Resistance value | Output voltage | Output value |
| --- | --- | --- | --- |
| 1 | $R_{AP}$ | $V_{AP}$ | 0 |
| 0 | $R_P$ | $V_P$ | 1 |

Next, a logic function device with two inputs will be described.

Figure 5:
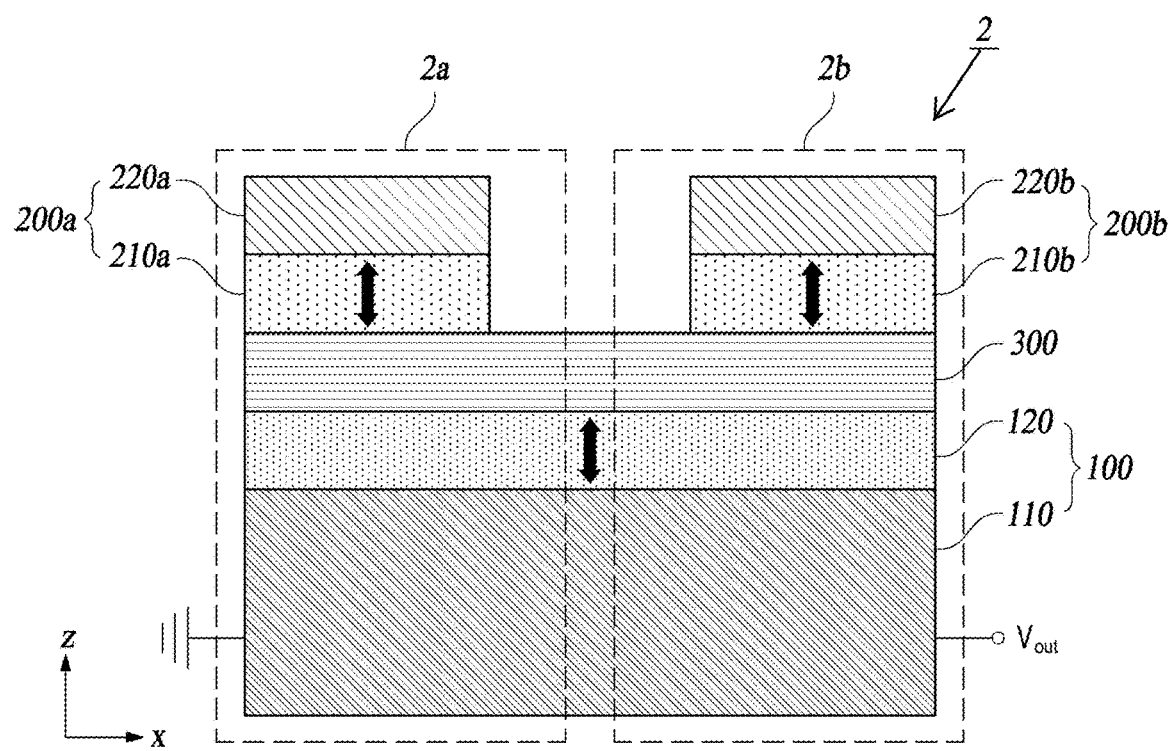
FIG. 5 is a cross-sectional view illustrating a binary logic function device according to an embodiment of the present invention.
Figure 6A:
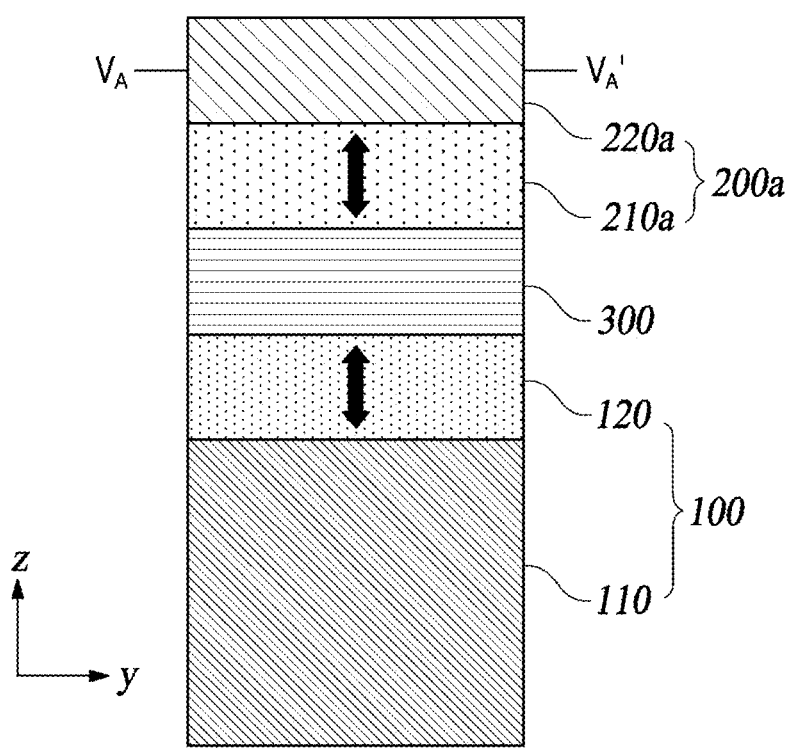
FIGS. 6A and 6B are cross-sectional views illustrating the logic function device of FIG. 5 viewed from other direction.
Figure 6B:
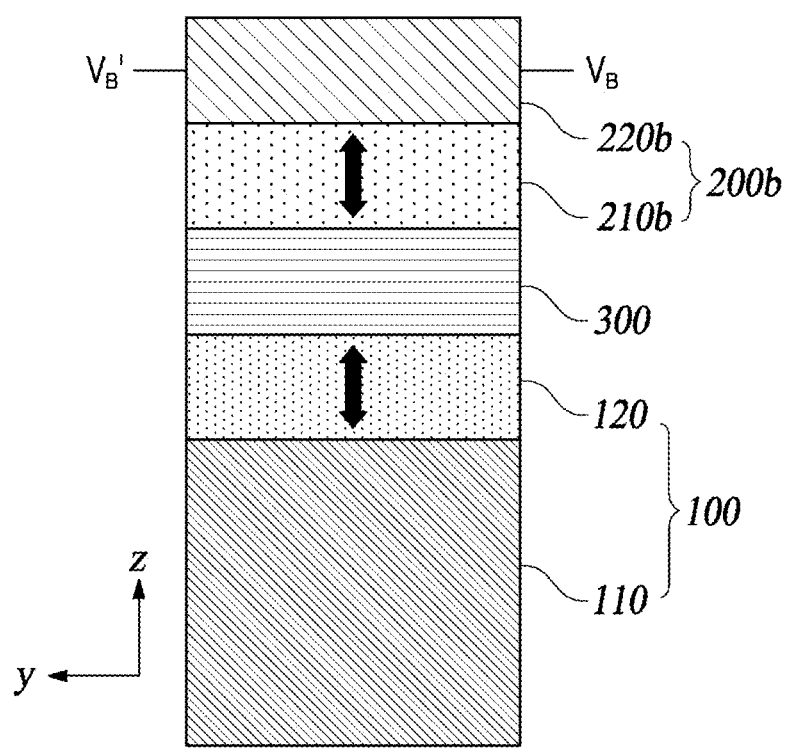

FIG. 5 is a cross-sectional view illustrating an x-z plane of a binary logic function device 2 according to an embodiment of the present invention, and FIGS. 6A and 6B are cross-sectional views illustrating a y-z plane of the logic function device 2 of FIG. 5. FIG. 6A shows a unit 2a and FIG. 6B shows a unit 2b.

Referring to FIGS. 5 and 6, the logic function device 2 according to an embodiment of the present invention includes an function reconfiguring unit 100 having magnetization in the vertical direction set by spin torque caused due to an function reconfiguring current and an output terminal formed at an end thereof; and a first input unit 200a and a second input unit 200b formed on the function reconfiguring unit 100 and having magnetization in one direction, for example, a vertical direction set by spin torque caused due to an input current, in which the output voltage $V_{out}$ of the output terminal is determined on the basis of whether the magnetization direction of the function reconfiguring unit 100 and the magnetization direction of the first input unit 200a and the magnetization direction of the function reconfiguring unit 100 and the magnetization direction of the second input unit 200b are parallel or anti-parallel to each other. An insulating tunnel junction 300 may be formed between the function reconfiguring unit 100 and the two input units 200a and 200b.

The function reconfiguring unit 100 may be configured in the same manner as in FIG. 1.

The first input unit 200a includes a first input magnetic layer 210a formed on the function reconfiguring unit 100 and having magnetization in one direction, for example, a vertical direction and the first input magnetic layer 210a, and a first input electrode layer 220 formed on the first input magnetic layer 210a and through which current flows to manipulate the magnetization in the first input magnetic layer 210a. The second input unit 200b includes a second input magnetic layer 210b formed on the function reconfiguring unit 100 and having magnetization in the same direction as the first input unit 200a, for example, in a vertical direction, and a second input electrode layer 220b formed on the second input magnetic layer 210b and through which current flows to manipulate the magnetization of the second input magnetic layer 210b. That is, according to the present embodiment, two input units 200a and 200b are arranged side by side in the x direction on the function reconfiguring unit 100.

It may be considered that the logic function device 2 of FIG. 5 is implemented by connecting two logic function devices 1 of FIG. 1 to each other in the x direction, and two portions of the logic function device 2 of FIG. 5 corresponding to the logic function device 1 of FIG. 1 are referred to as a unit 2a and a unit 2b, respectively.

Figure 7:
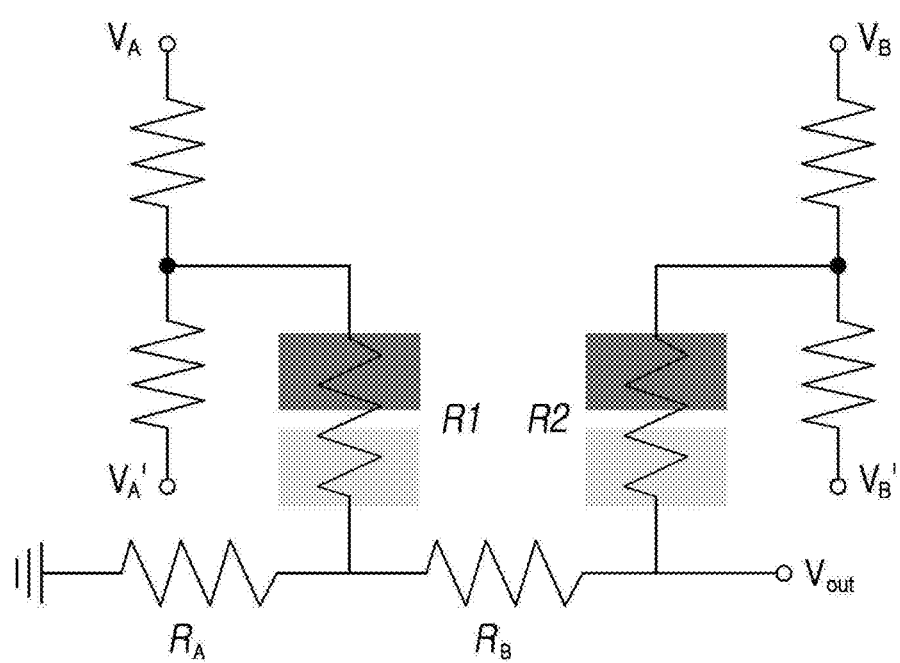
FIG. 7 is a circuit diagram modeling the logic function device 2 of FIG. 5.

FIG. 7 is a circuit diagram modeling the logic function device 2 of FIG. 5.

Referring to FIG. 7, a resistance R1 is a vertical resistance value according to the magnetization direction of the function reconfiguring unit 100 and the magnetization direction of the first input unit 200a, and a resistance R2 is a vertical resistance value according to the magnetization direction of the function reconfiguring unit 100 and the magnetization direction of the second input unit 200b. The resistance $R_A$ is a horizontal resistance value of the function reconfiguring unit 100a of the unit 2a of FIG. 5, and the resistor $R_B$ is a horizontal resistance value of the function reconfiguring unit 100b of the unit 2b of FIG. 5.

Referring to FIG. 7, the output voltage $V_{out}$ varies according to the resistance values R1 and R2 constituting the reconfigurable logic device 2 according to an embodiment of the present invention.

Table 2 shows output voltages according to each of the resistance values R1 and R2 constituting the reconfigurable logic device according to an embodiment of the present invention.

Considering that RAP>RP as described in FIGS. 3A and 3B, $V_{max} > V_1 > V_2 > V_{min}$ is satisfied in the circuit of FIG. 7.

TABLE 2

| R1 | R2 | Output voltage ($V_{out}$) |
|---|---|---|
| $R_P$ | $R_P$ | $V_{max}$ |
| $R_{AP}$ | $R_P$ | $V_1$ |

TABLE 2-continued

| R1 | R2 | Output voltage ($V_{out}$) |
|---|---|---|
| $R_P$ | $R_{AP}$ | $V_2$ |
| $R_{AP}$ | $R_{AP}$ | $V_{min}$ |

Based on the characteristics of Table 2, a logic device corresponding to the following example may be implemented using the reconfigurable logic device of FIG. 5.

First, in the logic function device 2 of FIG. 5, the magnetization direction of the function reconfiguring unit 100 is in the up direction; the reference voltage Vref is set between the maximum value $V_{max}$ of the output voltage $V_{out}$ and the first value $V_1$ of the output voltage $V_{out}$; the output value is set to "1" when the output voltage $V_{out}$ is greater than the reference voltage Vref; and the output value is set to "0" when the output voltage $V_{out}$ is smaller than the reference voltage, thereby performing an AND logic operation.

Specifically, the magnetization direction of the function reconfiguring magnetic layer 120 is set to the up direction by applying a current to the function reconfiguring electrode layer 110 of the logic function device 2 of FIG. 5. Herein, when the input of the first input unit 200a is "1", the magnetization direction Up of the input magnetic layer 210a constituting the first input unit 200a and the magnetization direction (Up) of the function reconfiguring magnetic layer 120 are parallel to each other, so that the unit 2a of FIG. 5 has a resistance value of $R_P$. Meanwhile, when the input of the second input unit 200b is "0", the magnetization direction (Down) of the input magnetic layer 210b constituting the second input unit 200b and the magnetization direction (Up) of the function reconfiguring magnetic layer 120 are anti-parallel to each other, so that the unit 2b of FIG. 5 has a resistance value of $R_{AP}$. When the reference voltage value $V_{ref}$ is set to satisfy $V_{max} > V_{ref} > V_1$; the output value is set to "1" when the output voltage is higher than the reference voltage value; and the output value is set to "0" when the output voltage is lower than the reference voltage value, an AND operation logic device may be configured as shown in [Table 3] through the output voltages of [Table 2]

TABLE 3

| Input value of first input unit | Input value of second input unit | R1 | R2 | Output voltage ($V_{out}$) | Output value |
|---|---|---|---|---|---|
| 1 | 1 | $R_P$ | $R_P$ | $V_{max}$ | 1 |
| 0 | 1 | $R_{AP}$ | $R_P$ | $V_1$ | 0 |
| 1 | 0 | $R_P$ | $R_{AP}$ | $V_2$ | 0 |
| 0 | 0 | $R_{AP}$ | $R_{AP}$ | $V_{min}$ | 0 |

Next, in the logic function device 2 of FIG. 5, the magnetization direction of the function reconfiguring unit 100 is in the up direction; the reference voltage Vref is set between the second value $V_2$ of the output voltage $V_{out}$ and the minimum value $V_{min}$ of the output voltage; the output value is set to "1" when the output voltage $V_{out}$ is greater than the reference voltage Vref; and the output value is set to "0" when the output voltage $V_{out}$ is less than the reference voltage Vref, thereby performing an OR logic operation.

Specifically, the magnetization direction of the function reconfiguring magnetic layer 120 is set to Up by applying a current to the function reconfiguring electrode layer 110 of the logic function device 2 of FIG. 5. Herein, when the input of the first input unit 200a is "1", the magnetization direction (Up) of the input magnetic layer 210a and the magnetization direction (Up) of the function reconfiguring magnetic layer 120 are parallel to each other, so that the unit 2a of FIG. 5 has a resistance value of $R_P$. Meanwhile, when the input of the second input unit 200b is "0", the magnetization direction (Down) of the input magnetic layer 210b and the magnetization direction (Up) of the function reconfiguring magnetic layer 120 are anti-parallel to each other, so that the unit 2b of FIG. 5 has a resistance value of RAP. When the reference voltage value $V_{ref}$ is set to satisfy $V_2 > V_{ref} > V_{min}$, and the output value is set to "1" when the output voltage is higher than the reference voltage value, and the output value is set to "0" when the output voltage is lower than the reference voltage value, a NOR logic operation may be performed as in [Table 4] through the output voltages of [Table 2].

TABLE 4

| Input value of first input unit | Input value of second input unit | R1 | R2 | output voltage ($V_{out}$) | Output value |
|---|---|---|---|---|---|
| 1 | 1 | $R_P$ | $R_P$ | $V_{max}$ | 1 |
| 0 | 1 | $R_{AP}$ | $R_P$ | $V_1$ | 1 |
| 1 | 0 | $R_P$ | $R_{AP}$ | $V_2$ | 1 |
| 0 | 0 | $R_{AP}$ | $R_{AP}$ | $V_{min}$ | 0 |

Next, in the logic function device 2 of FIG. 5, the magnetization direction of the function reconfiguring unit 100 is in the down direction; the reference voltage Vref is set between the maximum value $V_{max}$ of the output voltage $V_{out}$ and the first value $V_1$ of the output voltage; the output value is set to "1" when the output voltage $V_{out}$ is greater than the reference voltage Vref; and the output value is set to "0" when the output voltage $V_{out}$ is less than the reference voltage Vref, thereby performing a NOR logic operation.

Specifically, the magnetization direction of the function reconfiguring magnetic layer 120 is set to Down by applying a current to the function reconfiguring electrode layer 110 of the logic function device 2 of FIG. 5. Herein, when the input of the first input unit 200a is "1", the magnetization direction (Up) of the input magnetic layer 210a and the magnetization direction (Down) of the function reconfiguring magnetic layer 120 are anti-parallel to each other, so that the unit 2a of FIG. 5 has a resistance value of $R_{AP}$. Meanwhile, when the input of the second input unit 200b is "0", the magnetization direction (Down) of the input magnetic layer 210b and the magnetization direction (Down) of the function reconfiguring magnetic layer 120 are parallel to each other, so that the unit 2b of FIG. 5 has a resistance value of $R_P$. When the reference voltage value $V_{ref}$ is set to satisfy $V_{max} > Vref > V_1$, and the output value is set to "1" when the output voltage is higher than the reference voltage value, and the output value is set to "0" when the output voltage is lower than the reference voltage value, a NOR logic operation may be performed as in [Table 5] through the output voltage of [Table 2].

TABLE 5

| Input value of first input unit | Input value of second input unit | R1 | R2 | Output voltage ($V_{out}$) | Output value |
|---|---|---|---|---|---|
| 1 | 1 | $R_{AP}$ | $R_{AP}$ | $V_{min}$ | 0 |
| 0 | 1 | $R_P$ | $R_{AP}$ | $V_2$ | 0 |
| 1 | 0 | $R_{AP}$ | $R_P$ | $V_1$ | 0 |
| 0 | 0 | $R_P$ | $R_P$ | $V_{max}$ | 1 |

Next, in the logic function device 2 of FIG. 5, the magnetization direction of the function reconfiguring unit 100 is in the down direction; the reference voltage Vref is set between the second value $V_2$ of the output voltage $V_{out}$ and the minimum value $V_{min}$ of the output voltage; the output value is set to "1" when the output voltage $V_{out}$ is greater than the reference voltage Vref; and the output value is set to "0" when the output voltage $V_{out}$ is less than the reference voltage Vref, thereby performing a NAND logic operation.

Specifically, the magnetization direction of the function reconfiguring magnetic layer 120 is set to Down by applying a current to the function reconfiguring electrode layer 110 of the logic function device 2 of FIG. 5. Herein, when the input of the first input unit 200a is "1", the magnetization direction Up of the input magnetic layer 210a and the magnetization direction Down of the function reconfiguring magnetic layer 120 are anti-parallel to each other, so that the unit 2a of FIG. 5 has a resistance value of RAP Meanwhile, when the input of the second input unit 200b is "0", the magnetization direction (Down) of the input magnetic layer 210b and the magnetization direction (Down) of the function reconfiguring magnetic layer 120 are parallel to each other, so that the logic function device 2b of FIG. 6 has a resistance value of $R_P$. When the reference voltage value Vref is set to satisfy $V_2 > Vref > V_{min}$, and the output value is set to "1" when the output voltage is higher than the reference voltage value, and the output value is set to "0" when the output voltage is lower than the reference voltage value, a NOR logic operation may be performed as in [Table 6] through the output voltages of [Table 2].

TABLE 6

| Input value of first input unit | Input value of second input unit | R1 | R2 | Output voltage ($V_{out}$) | Output value |
|---|---|---|---|---|---|
| 1 | 1 | $R_{AP}$ | $R_{AP}$ | $V_{min}$ | 0 |
| 0 | 1 | $R_P$ | $R_{AP}$ | $V_2$ | 1 |
| 1 | 0 | $R_{AP}$ | $R_P$ | $V_1$ | 1 |
| 0 | 0 | $R_P$ | $R_P$ | $V_{max}$ | 1 |

Figure 8:
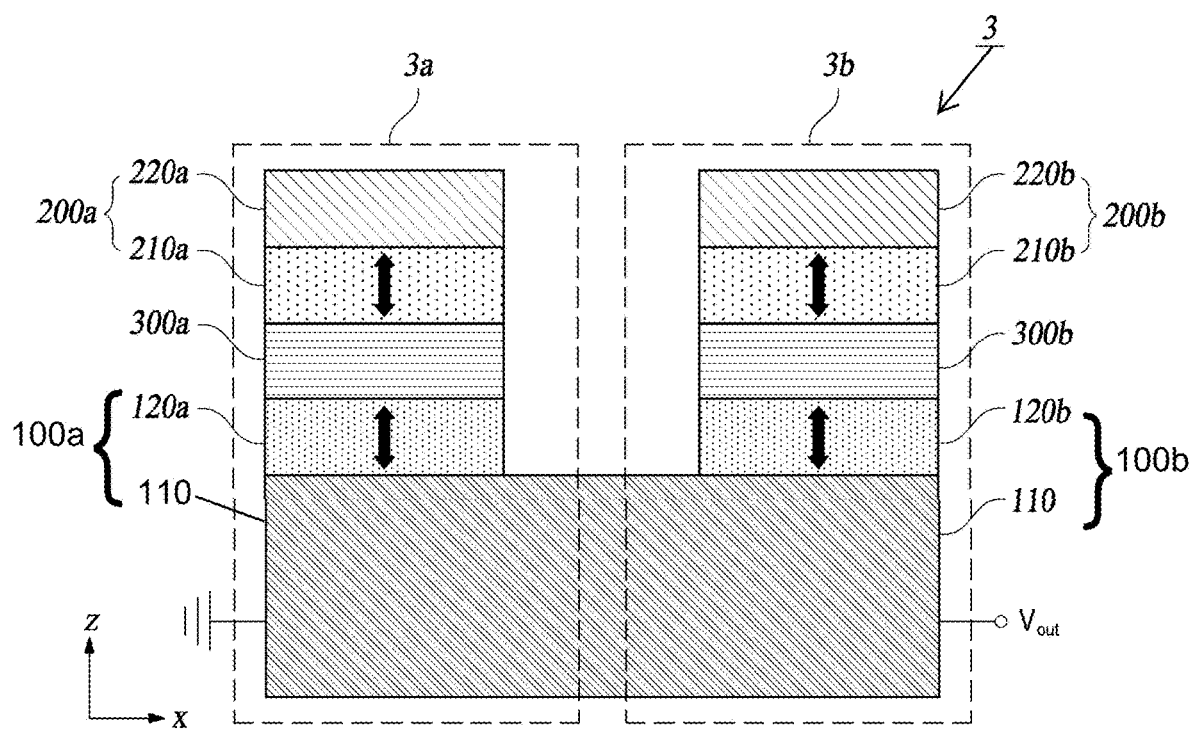
FIG. 8 is a cross-sectional view illustrating a binary logic function device according to an embodiment of the present invention.

FIG. 8 is a cross-sectional view illustrating a binary logic function device 3 according to an embodiment of the present invention.

Referring to FIG. 8, the logic function device 3 according to the embodiment of the present invention has multiple function reconfiguring units 100a and 100b and multiple input units 200a and 200b arranged in horizontal directions respectively, in which the function reconfiguring units 100a and 100b and the input units 200a and 200b are formed to vertically correspond to each other, and the magnetization directions of the multiple function reconfiguring units 100a and 100b may be set independently of each other.

According to an embodiment, the multiple function reconfiguring units 100a and 100b may include an function reconfiguring electrode layer 110 through which an function reconfiguring current flows; and multiple function reconfiguring magnetic layers 120a and 120b horizontally formed on the function reconfiguring electrode layer 110 at a predetermined interval and having magnetization in one direction, for example, a vertical direction, set by an function reconfiguring current. A part of the function reconfiguring magnetic layers 120a and 120b to which the voltage is applied in one direction and a remainder of the function reconfiguring magnetic layers to which no voltage is applied have magnetic anisotropy different from each other, and the magnetization directions of the part of the function reconfiguring magnetic layers and the remainder of the function reconfiguring magnetic layers may be set opposite to each other by an function reconfiguring current.

The logic function device 3 of FIG. 8 is different from the logic function device 2 of FIG. 5 in that the tunnel junctions 300a and 300b and the function reconfiguring magnetic layers 220a and 200b below the first and second input units 200a and 200b are separated from each other.

It may be considered that the logic function device 3 of FIG. 8 is implemented by connecting two units 3a and 3b.

However, in the present embodiment, since the function reconfiguring magnetic layers 120a and 120b are separated from each other, the magnetization directions of the function reconfiguring magnetic layers 120a and 120b may be set differently.

For example, the magnetic anisotropy is instantaneously lowered by vertically applying a voltage only to one of the units 3a and 3b, thereby reducing the power required to switch the function reconfiguring magnetic layer of the corresponding logic function device.

Specifically, a current is applied to the function reconfiguring electrode layer 110 of the logic function device 3 of FIG. 8. Herein, when the above magnetic anisotropy is utilized through the vertical voltage application, it is possible to apply the vertical voltage only to the unit 3a.

Herein, since the function reconfiguring magnetic layers 120a and 120b have different magnetic anisotropy and have switching threshold currents different from each other, when the current values flowing through the function reconfiguring electrode layer 110 are taken as a value between the function reconfiguring magnetic layers 120a and 120b, only magnetization direction of the function reconfiguring magnetic layer 120a included in the unit 3a may be selectively switched. Similarly, when the vertical voltage is applied only to the unit 3b, only the operation setting magnetic layer 120b may be selectively switched. In this manner, the function reconfiguring magnetic layers 120a and 120b may be independently controlled through a current applied to the function reconfiguring electrode layer 110.

In this manner, a NOT A AND B operation may be performed using the logic function device 3 of FIG. 8.

Specifically, the magnetization direction of the function reconfiguring magnetic layer 120a included in the unit 3a is set to the down direction, and the magnetization direction of the function reconfiguring magnetic layer 120b included in the unit 3b is set to the up direction. When the input of the first input unit 200a is "1", the magnetization direction (Up) of the input magnetic layer 210a and the magnetization direction (Down) of the function reconfiguring magnetic layer 120a are anti-parallel, so that the logic function device 3a has a resistance value of R. When the input of the first input unit 200a is "0", the logic function device (Down) of the input magnetic layer 210a and the magnetization direction (Down) of the function reconfiguring magnetic layer 120a are parallel, so that the logic function device 3a has a resistance value of $R_P$. When the input of the second input unit 200b is "1", the magnetization direction (Up) of the input magnetic layer 210b and the magnetization direction (Up) of the function reconfiguring magnetic layer 120b are parallel, so that the logic function device 3b has a resistance value of $R_P$. When the input of the second input unit 200b is "0", the magnetization direction (Down) of the input magnetic layer 210b and the magnetization direction (Up) of the function reconfiguring magnetic layer 120b are anti-parallel, so that the function reconfiguring logic device 3b has a resistance value of RAP. When the reference voltage value Vref is set to satisfy $V_{max} > V_{ref} > V_1$; the output value is set to "1" when the output voltage is higher than the reference voltage value; and the output value is set to "0" when the output voltage is lower than the reference voltage value, a NOT A AND B operation may be performed as shown in [Table 7] through output voltages of [Table 2].

TABLE 7

| Input value of first input unit | Input value of second input unit | R1 | R2 | Output voltage ($V_{out}$) | Output value |
|---|---|---|---|---|---|
| 1 | 1 | $R_{AP}$ | $R_P$ | $V_1$ | 0 |
| 0 | 1 | $R_P$ | $R_P$ | $V_{max}$ | 1 |
| 1 | 0 | $R_{AP}$ | $R_{AP}$ | $V_{min}$ | 0 |
| 0 | 0 | $R_P$ | $R_{AP}$ | $V_2$ | 0 |

Figure 9:
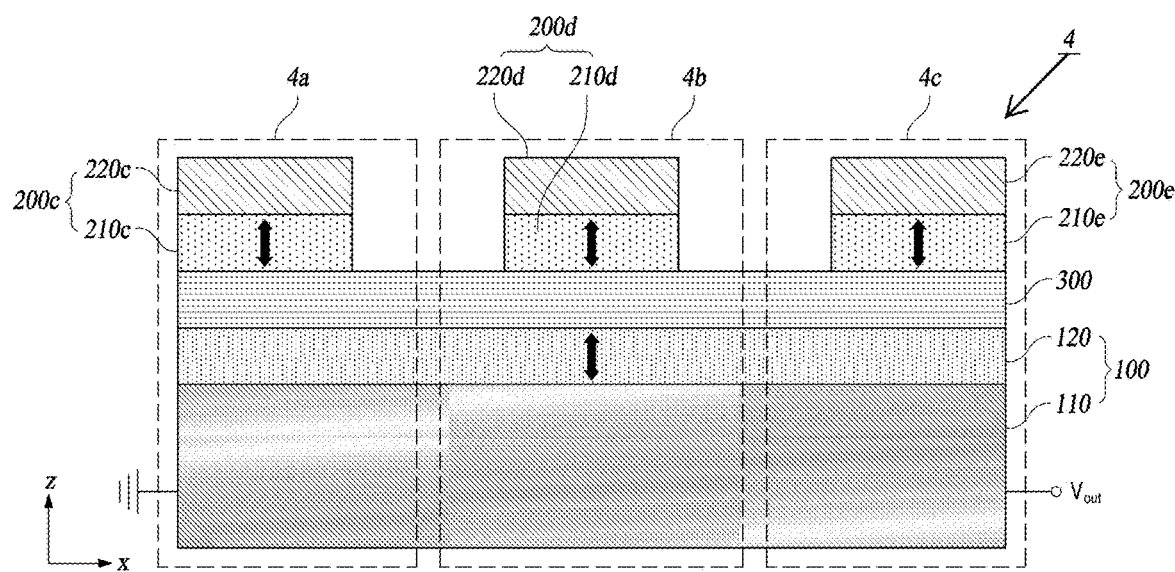
FIG. 9 is a cross-sectional view illustrating a ternary logic function device according to an embodiment of the present invention.

FIG. 9 is a cross-sectional view of a ternary logic function device 4 according to an embodiment of the invention.

Referring to FIG. 9, the logic function device 4 includes a third input unit 200c, a fourth input unit 200d, and a fifth input unit 200e, and perform a ternary logic operation, in which one terminal of the function reconfiguring unit 100 located on the third input unit 200c is connected to the ground voltage, and the output terminal is horizontally opposite to the one terminal of the function reconfiguring unit 100 and is located on the fifth input unit 200e.

According to an embodiment, the magnetization direction of the function reconfiguring unit 100 is in the up direction, and the reference voltage (Vref) is set between the output voltage value when the magnetization direction of the third input unit 200c and the magnetization direction of the function reconfiguring unit 100 are parallel, the magnetization direction of the fourth input unit 200d and the magnetization direction of the function reconfiguring unit 100 are parallel, and the magnetization direction of the fifth input unit 200e and the magnetization direction of the function reconfiguring unit 100 are parallel, and the output voltage value when the magnetization direction of the third input unit 200c and the magnetization direction of the function reconfiguring unit 100 are anti-parallel, the magnetization direction of the fourth input unit 200d and the magnetization direction of the function reconfiguring unit 100 are parallel, and the magnetization direction of the fifth input unit 200e and the magnetization direction of the function reconfiguring unit 100 are parallel. The output value is set to "1" when the output voltage is greater than the reference voltage, and the output value is set to "0" when the output voltage is less than the reference voltage, thereby performing the ternary AND logic operation.

Specifically, it will be considered that the logic function device 4 of FIG. 9 may have three units 4a, 4b, and 4c horizontally connected to each other. The magnetization direction of the function reconfiguring magnetic layer 120 is set to the up direction by applying a current to the function reconfiguring electrode layer 110. Herein, when the input of the third input unit 200c is set to "1", the magnetization direction Up of the input magnetic layer 210c and the magnetization direction Up of the function reconfiguring magnetic layer 120 are parallel to each other, so that the unit 4a has a resistance value of $R_P$. Meanwhile, when the input of the fourth input unit 200d is set to "0", the magnetization direction (Down) of the input magnetic layer 210d and the magnetization direction (Up) of the function reconfiguring magnetic layer 120 are anti-parallel, so that the unit 4b has a resistance value of R. In a manner similar to that shown in Table 2, when the resistances of the units 4a, 4b, and 4c are all $R_P$, the output voltage becomes the maximum, which is called $V_{max}'$. The maximum value of the seven output voltages generated in other cases is called $V_1'$. According to definition, $V_{max}'>V_1'$ is satisfied. When the reference voltage Vref is set to satisfy $V_{max}'>V_{ref}>V_1'$, and the output value is set to "1" when the output voltage is higher than the reference voltage value, and the output value is set to "0" when the output voltage is lower than the reference voltage value, a ternary AND operation may be performed as in [Table 8].

TABLE 8

| Input value of third input unit | Input value of fourth input unit | Input value of fifth input unit | Output value |
| --- | --- | --- | --- |
| 1 | 1 | 1 | 1 |
| 0 | 1 | 1 | 0 |
| 1 | 0 | 1 | 0 |
| 0 | 0 | 1 | 0 |
| 1 | 1 | 0 | 0 |
| 0 | 1 | 0 | 0 |
| 1 | 0 | 0 | 0 |
| 0 | 0 | 0 | 0 |

As mentioned above, the present invention has been described in detail through the preferred embodiments, but the present invention is not limited thereto, and various changes and applications may be made without departing from the technical spirit of the present invention. Therefore, the true scope of protection of the present invention should be interpreted by the following claims, and all technical ideas within the equivalent scope should be construed as being included in the scope of the present invention.

The invention claimed is:

1. A logic function device, comprising:
one function reconfiguring unit having magnetization in one direction set by spin torque caused due to a function reconfiguring current, and having an output terminal; and
one input unit formed on the function reconfiguring unit and having magnetization in the one direction set by spin torque caused due to an input current,
wherein an output voltage of the output terminal is determined on the basis of whether a magnetization direction of the function reconfiguring unit and a magnetization direction of the input unit are parallel or anti-parallel,
a value ($V_P$) of the output voltage when the magnetization direction of the function reconfiguring unit and the magnetization direction of the input unit are parallel, is greater than a value (Vap) of the output voltage when the magnetization direction of the function reconfiguring unit and the magnetization direction of the input unit are anti-parallel; and
the output value is set to "1" when the value of the output voltage is $V_P$, and the output value is set to "0" when the value of the output voltage is Vap, to perform a NOT logic operation.

2. The device of claim 1, wherein the magnetization directions of the function reconfiguring unit and the input unit are any one of a vertical direction and a horizontal direction.

3. The device of claim 1, wherein the function reconfiguring unit includes:
a function reconfiguring electrode layer through which the function reconfiguring current flows; and
a function reconfiguring magnetic layer formed on the function reconfiguring electrode layer and having magnetization in one direction set by the function reconfiguring current,
wherein the output terminal is formed in the function reconfiguring electrode layer.

4. The device of claim 1, wherein the input unit includes:
an input magnetic layer formed on the function reconfiguring unit and having magnetization in the one direction; and
an input electrode layer formed on the input magnetic layer and through which the input current flows to manipulate the magnetization of the input magnetic layer.

5. A logic function device, comprising:
one or more function reconfiguring units having magnetization in one direction set by spin torque cause due to a function reconfiguring current, and having an output terminal; and
one or more input units formed on the function reconfiguring unit and having magnetization in the one direction set by spin torque caused due to an input current,
wherein an output voltage of the output terminal is determined on the basis of whether a magnetization direction of the function reconfiguring unit and a magnetization direction of the input unit are parallel or anti-parallel, wherein the number of function reconfiguring units is one;
the number of input units is multiple and horizontally arranged on the function reconfiguring unit; and
the magnetization direction of the function reconfiguring unit is set to be the same for the multiple input units.

6. The device of claim 5, wherein the input unit includes a first input unit and a second input unit;
one terminal of the function reconfiguring unit located on the first input unit is connected to a ground voltage, and the output terminal is horizontally opposite to the one terminal of the function reconfiguring unit and located on the second input unit; and
a maximum value ($V_{max}$) of the output voltage when the magnetization direction of the first input unit and the magnetization direction of the function reconfiguring unit are parallel, and the magnetization direction of the second input unit and the magnetization direction of the function reconfiguring unit are parallel, a first value ($V_1$) of the output voltage when the magnetization direction of the first input unit and the magnetization direction of the function reconfiguring unit are anti-parallel, and the magnetization direction of the second input unit and the magnetization direction of the function reconfiguring unit are parallel, a second value ($V_2$) of the output voltage when the magnetization direction of the first input unit and the magnetization direction of the function reconfiguring unit are parallel, and the magnetization direction of the second input unit and the magnetization direction of the function reconfiguring unit are anti-parallel, and a minimum value ($V_{min}$) of the output voltage when the magnetization direction of the first input unit and the magnetization direction of the function reconfiguring unit are anti-parallel, and the magnetization direction of the second input unit and the magnetization direction of the function reconfiguring unit are anti-parallel satisfy the following relationship:

$$V_{max}>V_1>V_2>V_{min}.$$

7. The device of claim 6, wherein the magnetization direction of the function reconfiguring unit is an up direction;
a reference voltage (Vref) is set between the maximum value ($V_{max}$) of the output voltage and the first value ($V_1$) of the output voltage; and
the output value is set to "1" when the output voltage is greater than the reference voltage, and the output value is set to "0" when the output voltage is less than the reference voltage, thereby performing an AND logic operation.

8. The device of claim 6, wherein the magnetization direction of the function reconfiguring unit is an up direction;
a reference voltage (Vref) is set between the second value ($V_2$) of the output voltage and the minimum value ($V_{min}$) of the output voltage; and
the output value is set to "1" when the output voltage is greater than the reference voltage, and the output value is set to "0" when the output voltage is less than the reference voltage, thereby performing an OR logic operation.

9. The device of claim 6, wherein the magnetization direction of the function reconfiguring unit is a down direction;
a reference voltage (Vref) is set between the maximum value ($V_{max}$) of the output voltage and the first value ($V_1$) of the output voltage; and
the output value is set to "1" when the output voltage is greater than the reference voltage, and the output value is set to "0" when the output voltage is less than the reference voltage, thereby performing a NOR logic operation.

10. The device of claim 6, wherein the magnetization direction of the function reconfiguring unit is a down direction;
a reference voltage (Vref) is set between the second value ($V_2$) of the output voltage and the minimum value ($V_{min}$) of the output voltage; and
the output value is set to "1" when the output voltage is greater than the reference voltage, and the output value is set to "0" when the output voltage is less than the reference voltage, thereby performing a NAND logic operation.

11. The device of claim 5, wherein the input unit includes a third input unit, a fourth input unit, and a fifth input unit; and
one terminal of the function reconfiguring unit located on the third input unit is connected to a ground voltage, and the output terminal is horizontally opposite to the one terminal of the function reconfiguring unit and located on the fifth input unit side, thereby performing a ternary logic operation.

12. The device of claim 11, wherein the magnetization direction of the function reconfiguring unit is an up direction;
a reference voltage is set between a value of the output voltage when the magnetization direction of the third input unit and the magnetization direction of the function reconfiguring unit are parallel, the magnetization direction of the fourth input unit and the magnetization direction of the function reconfiguring unit are parallel, and the magnetization direction of the fifth input unit and the magnetization direction of the function reconfiguring unit are parallel, and a value of the output voltage when the magnetization direction of the third input unit and the magnetization direction of the function reconfiguring unit are anti-parallel, the magnetization direction of the fourth input unit and the magnetization direction of the function reconfiguring unit are parallel, and the magnetization direction of the fifth input unit and the magnetization direction of the function reconfiguring unit are parallel; and
the output value is set to "1" when the output voltage is greater than the reference voltage, and the output value is set to "0" when the output voltage is less than the reference voltage, thereby performing a ternary AND logic operation.

13. A logic function device, comprising:
one or more function reconfiguring units having magnetization in one direction set by spin torque cause due to a function reconfiguring current, and having an output terminal; and
one or more input units formed on the function reconfiguring unit and having magnetization in the one direction set by spin torque caused due to an input current,
wherein an output voltage of the output terminal is determined on the basis of whether a magnetization direction of the function reconfiguring unit and a magnetization direction of the input unit are parallel or anti-parallel,
wherein the one or more function reconfiguring units and the one or more input units are each horizontally arranged, and the function reconfiguring unit and the input unit are formed to vertically correspond to each other; and
the magnetization directions of the one or more function reconfiguring units are set independently of each other.

14. The device of claim 13, wherein the one or more function reconfiguring units include:
a function reconfiguring electrode layer through which the function reconfiguring current flows; and
multiple function reconfiguring magnetic layers horizontally formed on the function reconfiguring electrode layer at a predetermined interval and having magnetization in the one direction set by the function reconfiguring current,
wherein a part of the multiple function reconfiguring magnetic layers to which a voltage is applied in the one direction and a remainder of the function reconfiguring magnetic layers to which the voltage is not applied have magnetic anisotropy different from each other, and
the magnetization directions of the part of a multiple reset magnetic layers and the remainder of the function reconfiguring magnetic layers are set opposite to each other by the function reconfiguring current.

* * * * *